United States Patent [19]
Ewer

[11] Patent Number: 6,075,286
[45] Date of Patent: Jun. 13, 2000

[54] STRESS CLIP DESIGN

[75] Inventor: Peter R. Ewer, Surrey, United Kingdom

[73] Assignee: International Rectifier Corporation, El Segundo, Calif.

[21] Appl. No.: 09/016,372

[22] Filed: Jan. 30, 1998

Related U.S. Application Data

[60] Provisional application No. 60/048,285, Jun. 2, 1997.

[51] Int. Cl.[7] .......................... H01L 23/495; H01L 23/48; H01L 23/52
[52] U.S. Cl. .......................... 257/692; 257/669; 257/666; 257/695; 257/696
[58] Field of Search .................................... 257/692, 669, 257/666, 694–698

[56] References Cited

U.S. PATENT DOCUMENTS

| | | | |
|---|---|---|---|
| 2,869,053 | 1/1959 | Schaper . | |
| 3,519,890 | 7/1970 | Ashby . | |
| 3,821,615 | 6/1974 | Nordstrom et al. . | |
| 3,988,171 | 10/1976 | Miller et al. | 257/747 |
| 4,125,740 | 11/1978 | Paletto | 257/669 |
| 4,194,174 | 3/1980 | DeLise | 257/736 |
| 4,963,975 | 10/1990 | Sawaya | 257/669 |
| 4,984,063 | 1/1991 | Terashima | 257/669 |
| 5,041,901 | 8/1991 | Kitano et al. | 257/669 |
| 5,053,852 | 10/1991 | Biswas et al. | 257/669 |
| 5,231,303 | 7/1993 | Kasahara et al. | 257/669 |
| 5,250,839 | 10/1993 | Katoh et al. | 257/669 |
| 5,365,106 | 11/1994 | Watanabe | 257/669 |
| 5,581,118 | 12/1996 | Mays | 257/666 |
| 5,886,400 | 3/1999 | Letterman, Jr. et al. | 257/675 |

*Primary Examiner*—Mahshid Saadat
*Assistant Examiner*—Jhihan B. Clark
*Attorney, Agent, or Firm*—Ostrolenk, Faber, Gerb & Soffen, LLP

[57] ABSTRACT

A semiconductor package includes a base plate, a semiconductor die having top and bottom surfaces, the bottom surface being mounted to the base plate, and a conductor tab having first and second ends, the first end being adapted to communicate with and couple to external circuitry, the second end including a relatively wide foot having a plurality of finger portions separated by gaps, the finger portions being mounted to an covering a substantial portion of the top surface of the semiconductor die.

17 Claims, 4 Drawing Sheets

STRESS CLIP DESIGN

CROSS REFERENCE TO RELATED APPLICATION

This application is based on and claims priority to U.S. Provisional Patent Application No. 60/048,285, filed Jun. 2, 1997, entitled STRESS CLIP DESIGN.

BACKGROUND OF THE INVENTION

1. Field of the Invention

The present invention relates to tab connections made in semiconductor devices and, more particularly, to an improved tab for coupling to a pad on a semiconductor die, which tab includes stress relief elements to improve reliability. The present invention also relates to an improved tab for coupling to a printed circuit board or an insulated metal substrate (IMS).

2. Related Art

In conventional systems, wire-bonds are provided between the die of a semiconductor device and a lead frame for providing electrical connections therebetween. Specifically, one end of a relatively thin conductive wire (for example, a gold, aluminum or copper wire) is soldered or ultrasonically bonded to a pad on the die and the other end of the wire is coupled to a corresponding portion of the lead frame. Such electrical connections are relatively successful in providing reliable interconnection between the die and the lead frame even when numerous thermal cycles are experienced.

Where higher power handling semiconductors are involved, the use of thin wires for interconnecting the die to a higher level of packaging is unsatisfactory due to the high current levels present in such devices. Therefore, the interconnection between the top of the die and lead frame in a high power semiconductor device is typically made using a tab having a relatively wide cross section and a correspondingly large cross sectional area for handling high currents.

A conventional tab used to interconnect the die and the lead frame in a high power semiconductor device is shown in FIG. 1. The tab 10 includes a foot area 12 which is coupled to a semiconductor die 30 using, for example, solder 20. The foot area 12 is relatively large (i.e., covering at least about 25% of the die surface as shown in FIG. 1) for carrying high currents.

Although the tab 10 exhibits superior current carrying capabilities over wire-bonds of relatively thin construction, the large foot area 12 is subject to high thermal stress at the die-tab interface, for example, in the direction shown by the arrow X.

Usually, worst case thermal stress is exhibited when a package cools from an elevated temperature (for example, about 150° C.) to a lower temperature (for example, about 50° C.). During this cooling period, the foot area 12 shrinks and tends to bend the die upwardly. At the same time, a heat spreader (or pad, not shown) tends to bend the die downward. Since the solder 20 is usually the most deformable material involved, it elastically bends up to a point and then begins to creep or fail (i.e., plastic deformation).

The foot area 12 is also subject to thermal stress in the direction perpendicular to direction X and all other directions therebetween. Consequently, prior art tab systems tend to fail after successive thermal cycles.

Further, interconnections made between an electronic semiconductor package and a printed circuit board are typically made using leads which extend from the package to a pad on the printed circuit board. The leads are then connected to the pad, for example, using solder. The lead-pad interface is subject to the same type of thermal stresses described hereinabove with regard to a die-tab interface.

Still further, in some instances a semiconductor package, for example a TO-220 package, is coupled to a heatsink by way of a tab connector such that thermal coupling between the semiconductor package and the heatsink may be achieved. When the tab connector is coupled to the heatsink by way of solder or the like, the tab connector-heatsink interface is also subject to thermal stresses of the type described above.

Therefore, there is a need in the semiconductor packaging art for an interconnecting member capable of carrying high currents for electrically coupling a semiconductor die to a lead frame, a semiconductor package lead to a printed circuit board (or IMS), or a tab connector to a heatsink which is not subject to failure from successive thermal cycling.

SUMMARY OF THE INVENTION

In order to overcome the disadvantages of the interconnecting systems of the prior art, the present invention uses an interconnecting tab member having a combed foot area, the combed foot area including a plurality of tooth members extending from a portion of the tab for coupling to a semiconductor die, a printed circuit board pad, an IMS, or a heatsink. In an alternate embodiment, one or more of the tooth members are provided with a re-entrant bend for improving the resiliency of the foot area to thermal stress.

BRIEF DESCRIPTION OF THE DRAWING

For the purpose of illustrating the invention, there is shown in the drawing forms which are presently preferred, it being understood, however, that the invention is not limited to the precise arrangements and instrumentalities shown.

FIG. 4b shows a side view of the package of FIG. 4a;

DETAILED DESCRIPTION OF THE INVENTION

Figure 1:
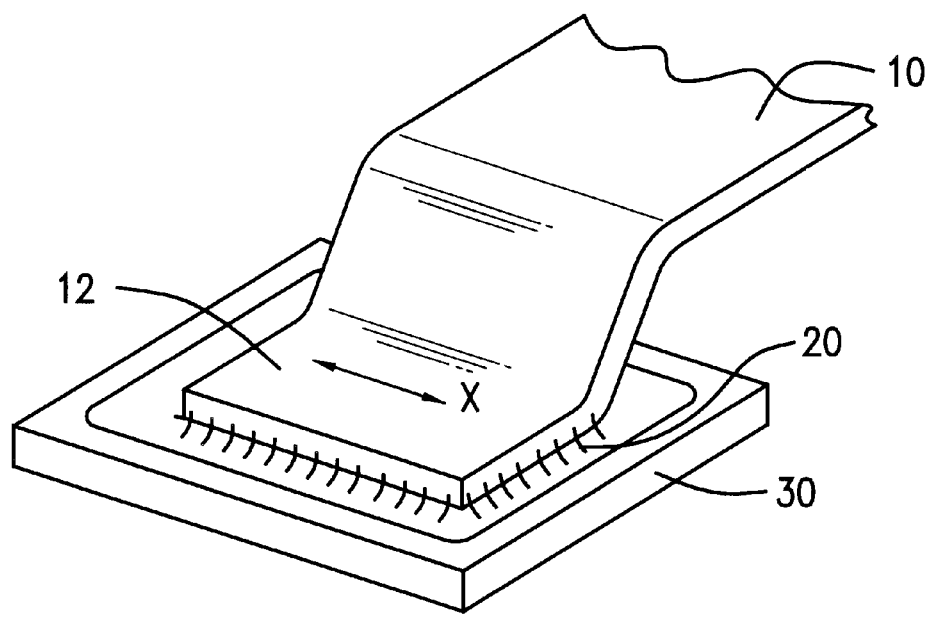
FIG. 1 shows a perspective view of an interconnecting tab of the prior art.
Figure 2:
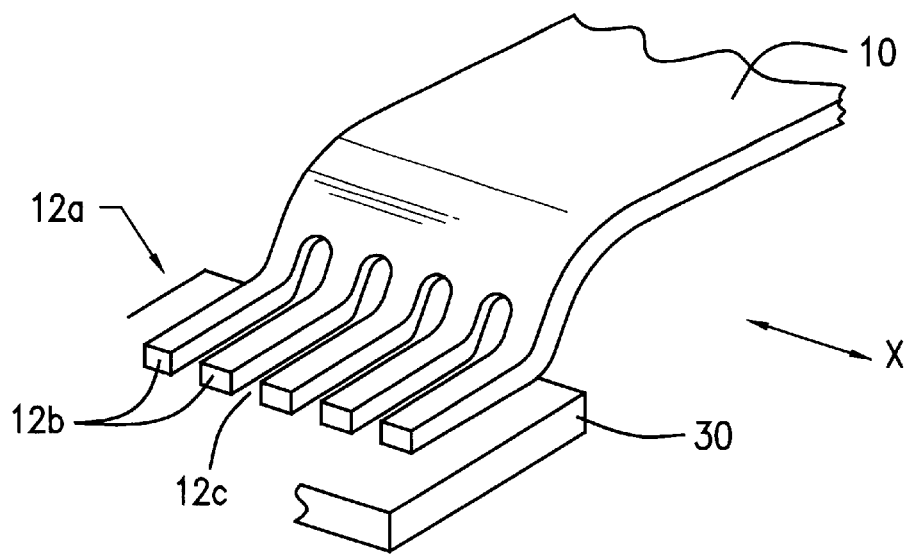
FIG. 2 shows a perspective view of an interconnecting tab in accordance with a first embodiment of the present invention.

Referring now to the drawings wherein like numerals indicate like elements, there is shown in FIG. 2 an interconnecting tab 10 in accordance with a first embodiment of the present invention. The foot 12a provides improved resiliency at the die-tab interface to thermal stresses, particularly in the direction indicated by the arrow X.

Specifically, the tab 10 includes a combed foot area 12a, where the combed foot area 12a is coupled to a semiconductor die 30. The combed foot area 12*a* is preferably coupled to the die 30 using solder, ultrasonic bonding, bond material or the like (not shown).

The combed foot area 12*a* is formed of a plurality of tooth members 12*b* (or fingers) separated by gaps 12*c*. It is preferred that the tooth members 12*b* and gaps 12*c* be relatively thin as compared to the width of the tab 10. The tooth members 12*b* and gaps 12*c*, in total, permit the tab 10 to flex, for example, in the X direction, in response to differences in expansion movement between the die 30 and the foot 12*a*. Such expansion movement occurs, for example, when the coupled die 30 and tab 10 are subjected to elevations and decreases in temperature and the respective materials used to form the die 30 and tab 10 have differing thermal coefficients of expansion (TCE).

It is further preferred that the tooth members 12*b* and the gaps 12*c* have widths which are approximately 5–30% that of the tab 10, where a tooth width being about 14% and a gap width being about 7% of the tab width is most preferred.

Figure 3:
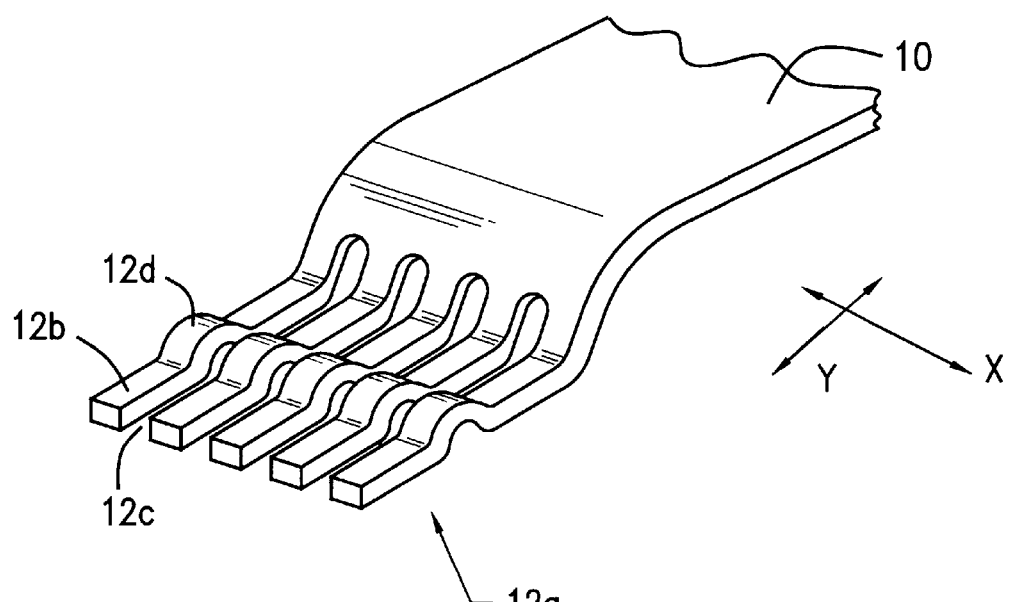
FIG. 3 shows a perspective view of an interconnecting tab in accordance with a second embodiment of the present invention.

FIG. 3 shows a tab 10 in accordance with a second embodiment of the present invention. The second embodiment provides improved resiliency to thermal stresses at the die-tab interface. As in FIG. 2, the tab 10 includes a combed foot area 12*a* formed of a plurality of tooth members 12*b* separated by gaps 12*c*.

The foot area 12*a* of the second embodiment of the present invention further includes at least one re-entrant bend 12*d* disposed on at least one tooth member 12*b*. The re-entrant bend 12*d* is a generally curved member along a portion of the length of the tooth members 12*b*. The re-entrant bend 12*d* permits the tooth member 12*d* to flex, for example, in the Y direction, in response to differences in expansion between the die 30 (not shown) and the tab 10. As discussed above, such differences in expansion may occur when the coupled die 30 and tab 10 (having differing TCEs) are subjected to elevations and decreases in temperature.

The re-entrant bends 12*d* provide improved thermal stress relief at the die-tab interface, for example, in the direction shown by the arrow Y. Thus, the interconnecting system shown in FIG. 3 provides thermal stress relief in a plurality of directions, for example in the X and Y directions.

Figure 4B:
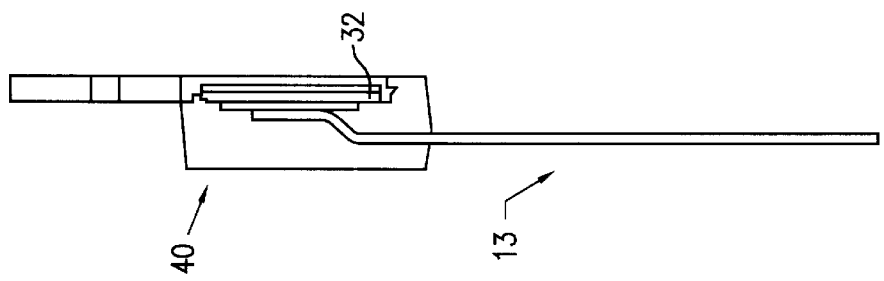
Figure 4A:
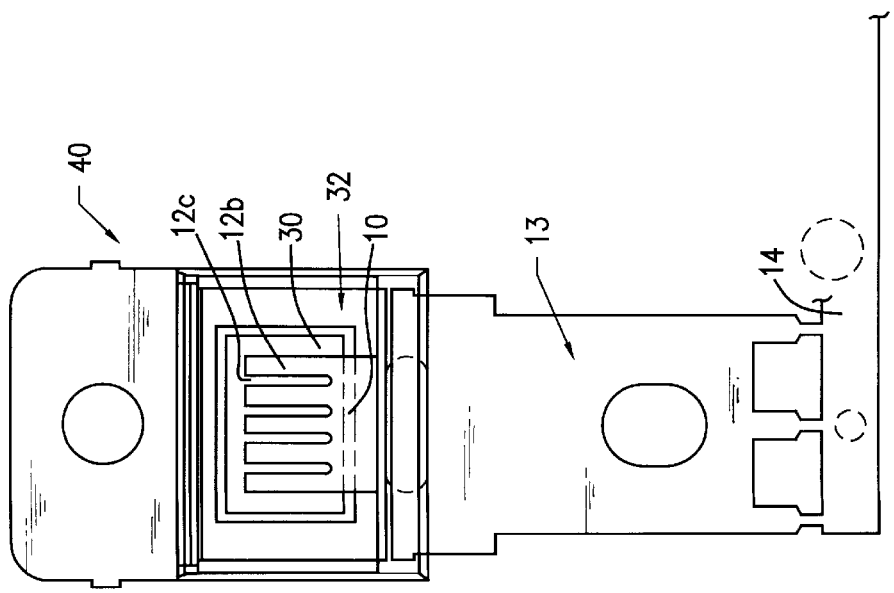
FIG. 4a shows a top plan view of the interconnecting tab of FIG. 2 incorporated into a semiconductor package.

Reference is now made to FIG. 4*a* which shows a semiconductor package 40 employing the interconnecting tab 10 of FIG. 2 to couple a conductor portion 13 to a semiconductor die 30 within the package 40. The semiconductor die 30 is mounted to a base plate (or substrate) 32 as is known in the art.

It is noted that the interconnecting tab 10 of FIG. 3 may also be employed in the semiconductor package 40. In other words, the conductor portion 13 of FIGS. 4*a* and 4*b* may also include a re-entrant bend 12*d*.

As best seen in FIG. 4*b*, the conductor portion 13 is integral to the interconnecting tab 10 in such a way that electrical current may flow between the die 30 and the conductor portion 13. It is noted that the conductor portion 13 is shown connected to a lead frame 14 as may be used, for example, during the manufacturing process where other conductor portions (not shown) are also connected thereto.

Figure 6:
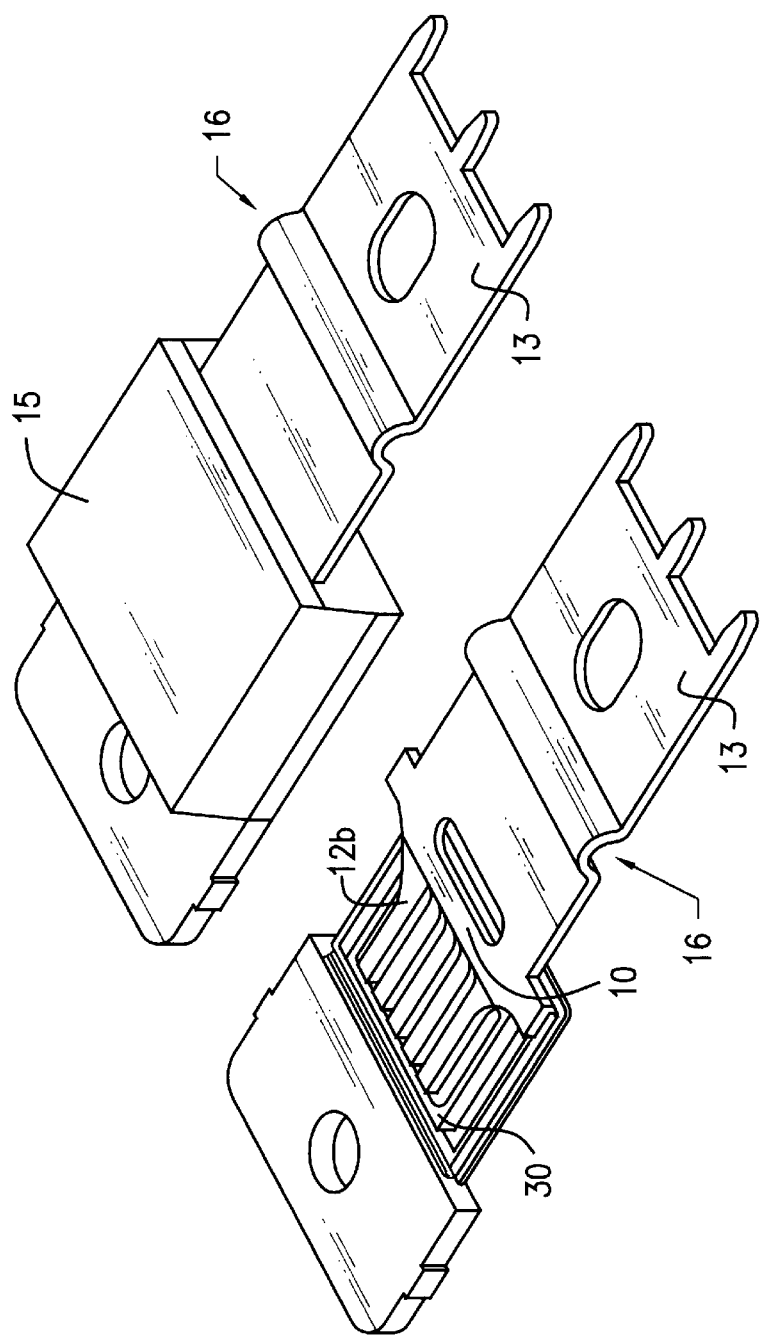
FIG. 6 shows perspective views of the package of FIGS. 4a and 4b with and without encapsulation and with a re-entrant bend in the conductor portion.

FIG. 6 shows a perspective view of the packages of FIGS. 4*a* and 4*b*, where in one view the encapsulation material 15 is removed and where the conductor portion 13 includes a re-entrant bend 16 to reduce thermal stress. It is noted that the re-entrant bend 16 may be located anywhere along the length of the conductor portion 13, where a location substantially close to the encapsulation material 15 is preferred.

Figure 5:
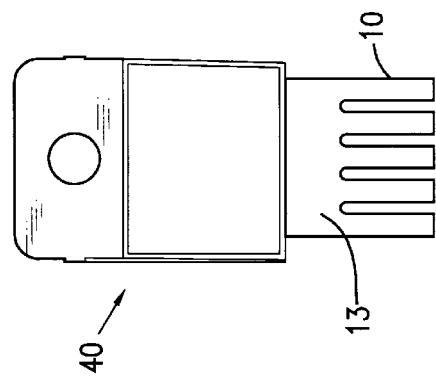
FIG. 5 shows a top plan view of a semiconductor package employing an interconnecting tab to couple a semiconductor package to a printed circuit board.

FIG. 5 shows a semiconductor package 40 employing the interconnecting tab 10 of FIG. 2 to couple a conductor portion 13 to, for example, a printed circuit board (PCB) or IMS (not shown). Thus, thermal stresses (which may occur from differing thermal expansion coefficients of the PCB and the conductor 13) may be relieved at the PCB-conductor interface. It is noted that the interconnecting tab 10 as shown in FIG. 3 may also be used to couple the conductor portion 13 to the PCB in order to improve the stress relief. In other words, the conductor portion 13 of FIG. 5 may also include a re-entrant bend 12*d*.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A semiconductor package, comprising:
   a base plate;
   a semiconductor die having top and bottom surfaces, the bottom surface being mounted to the base plate; and
   a conductor tab having first and second ends, the first end being adapted to communicate with and couple to external circuitry, the second end including a relatively wide foot having a plurality of finger portions separated by gaps, the finger portions being mounted to and covering a substantial portion of the top surface of the semiconductor die.

2. The semiconductor package of claim 1, wherein the finger portions and gaps are relatively thin as compared to a width of the foot of the tab.

3. The semiconductor package of claim 1, wherein at least one of the finger portions includes at least one re-entrant bend.

4. The semiconductor package of claim 1, wherein the semiconductor die is encapsulated and the conductor tab includes a re-entrant bend external to the encapsulation.

5. The semiconductor package of claim 2, wherein the finger portions and gaps have widths which are approximately 5–30% that of the foot of the tab 10.

6. The semiconductor package of claim 2, wherein the finger portions have widths of about 14% of and the gaps have widths of about 7% of the width of the foot of the tab.

7. The semiconductor package of claim 3, wherein the re-entrant bend is a generally curved member along a portion of the length of the finger portion.

8. A semiconductor package, comprising:
   a base plate;
   a semiconductor die having a length and width defining a die area and top and bottom surfaces, the bottom surface being mounted to the base plate;
   a conductor tab having a width substantially equal to or greater than the width of the semiconductor die, the conductor tab including: (i) one end having a foot adapted to mount to and cover a substantial portion of the top surface of the semiconductor die; (ii) a distal end being adapted to communicate with and couple to external circuitry; and (iii) a re-entrant bend disposed between the ends of the conductor tab; and
   an encapsulation material enclosing at least a portion of the base plate, the semiconductor die and the one end of the conductor tab, the re-entrant bend being external to the encapsulation.

9. The semiconductor package of claim 8, wherein the conductor tab extends out of the encapsulation material along a length and terminates at the distal end, the re-entrant bend being along the length.

10. The semiconductor package of claim 8, wherein the foot of the conductor tab includes a plurality of finger portions separated by gaps, the finger portions being mounted to and covering a substantial portion of the top surface of the semiconductor die.

11. The semiconductor package of claim 9, wherein the re-entrant bend is disposed along the length of the conductor tab and closer to the encapsulation material than to the distal end.

12. The semiconductor package of claim 11, wherein the finger portions and gaps are relatively thin as compared to a width of the foot of the tab.

13. The semiconductor package of claim 12, wherein the finger portions and gaps have widths which are approximately 5–30% that of the foot of the tab 10.

14. The semiconductor package of claim 13, wherein the finger portions have widths of about 14% of and the gaps have widths of about 7% of the width of the foot of the tab.

15. The semiconductor package of claim 11, wherein at least one of the finger portions includes at least one re-entrant bend.

16. The semiconductor package of claim 15, wherein the re-entrant bend is a generally curved member along a portion of the length of the finger portion.

17. The semiconductor package of claim 11, wherein the foot of the conductor tab covers at least about 25% of the top surface area of the semiconductor die.

\* \* \* \* \*